US008756045B2

(12) United States Patent
Droz et al.

(10) Patent No.: US 8,756,045 B2
(45) Date of Patent: Jun. 17, 2014

(54) METHOD, DEVICE, COMPUTER PROGRAM AND COMPUTER PROGRAM PRODUCT FOR DETERMINING A REPRESENTATION OF A SIGNAL

(75) Inventors: Patrick Droz, Rueschlikon (CH); Paul T. Hurley, Zurich (CH); John G. Rooney, Zurich (CH); Tomas Tuma, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 401 days.

(21) Appl. No.: 13/126,546

(22) PCT Filed: Oct. 29, 2009

(86) PCT No.: PCT/IB2009/054807
§ 371 (c)(1),
(2), (4) Date: Jun. 6, 2011

(87) PCT Pub. No.: WO2010/049906
PCT Pub. Date: May 6, 2010

(65) Prior Publication Data
US 2011/0276612 A1    Nov. 10, 2011

(30) Foreign Application Priority Data

Oct. 30, 2008  (EP) .................................... 08105710

(51) Int. Cl.
*G06F 17/50*    (2006.01)
(52) U.S. Cl.
USPC ......................................................... 703/13
(58) Field of Classification Search
USPC ....... 703/13; 702/66; 341/155; 375/141, 148; 375/260; 600/437
See application file for complete search history.

(56) References Cited

U.S. PATENT DOCUMENTS

2005/0180496 A1*  8/2005  Olson et al. .................. 375/148
2006/0293597 A1* 12/2006  Johnson et al. ............... 600/437

(Continued)

FOREIGN PATENT DOCUMENTS

JP    2006146484 A    6/2006
WO    2009082531 A1   7/2009

OTHER PUBLICATIONS

E.J. Candes. M.B. Wakin, "An Introduction To Compressive Sampling" internet article, Mar. 31, 2008, Retrieved from the Internet: URL:http://authors.library.caltech.edu/10092/1/CANieeespm08.pdf [retrieved on Mar. 18, 2011].

(Continued)

*Primary Examiner* — Kandasamy Thangavelu
(74) *Attorney, Agent, or Firm* — Cantor Colburn LLP; Gail Zarick (57) ABSTRACT

A method for determining a representation (y) of a signal (s) comprise selecting a predetermined number (m) of row vectors (v1, . . . , vm) from a predetermined measurement matrix (M). The predetermined measurement matrix (M) is predetermined dependent on a product of a predetermined Hadamard matrix or generalized Hadamard matrix (H) and a predetermined representation matrix(B). The predetermined representation matrix (B) represents a predetermined basis for the signal(s). The method further comprises determining a respective inner product of the signal (s) and each of the predetermined number (m) of selected row vectors (v1, . . . , vm) resulting in a predetermined number (m) of measurements (y1, . . . , ym) forming the representation (y) of the signal (s).

18 Claims, 4 Drawing Sheets

(56) References Cited

U.S. PATENT DOCUMENTS

| | | | |
|---|---|---|---|
| 2007/0211786 A1* | 9/2007 | Shattil | 375/141 |
| 2008/0031369 A1* | 2/2008 | Li et al. | 375/260 |
| 2008/0129568 A1* | 6/2008 | Brady et al. | 341/155 |
| 2008/0258958 A1* | 10/2008 | Toraichi et al. | 341/155 |
| 2009/0222226 A1* | 9/2009 | Baraniuk et al. | 702/66 |

OTHER PUBLICATIONS

Charles Constantine Gumas, "A century old, the fast Hadamard transform proves useful in digital communications", internet article, Nov. 30, 1997, Retrieved from the Internet: URL: http://archive.chipcenter.com/dsp/DSP000517F1.html [retrieved on Mar. 18, 2011].

E. J. Candes, "Compressive Sampling", internet article, Jan. 26, 2006, Retrieved from the internet: URL: http://www.stat.stanford.edu|candes/papers/CompressiveSampling.pdf [retrieved on Mar. 18, 2011].

Petros Dineas, Michael W. Mahoney, S. Muthukrishnan, Tamas Sarlos, "Faster Least Squares Approximation", internet article, Oct. 19, 2007, Retrieved from the Internet: URL: http://arxiv.org/PS-cache/arxiv/pdf/0710/0710.1435-2.pdf [retrieved on Mar. 18, 2011].

Toma Tuma, et al, "On the Applicability of Compressive Sampling in Fine Grained Processor Performance Monitoring," 2009 IEEE International Conference on Engineering of Complex Computer Systems, Jun. 2009, pp. 210-219.

Dong Liang, et al, "Accelerating Sensitivity Encoding Using Compressed Sensing," Engineering in Medicine and Biology Society, 2008 EMBS, 30th Annual International Conference of the IEEE, Aug. 20-24, 2008, pp. 1667-1670.

* cited by examiner

$n = 4$ $$B = \frac{1}{2}\begin{pmatrix} 1 & 1 & 1 & 1 \\ 1 & 1 & -1 & -1 \\ \sqrt{2} & -\sqrt{2} & 0 & 0 \\ 0 & 0 & \sqrt{2} & -\sqrt{2} \end{pmatrix}$$

$$H = \begin{pmatrix} 1 & 1 & 1 & 1 \\ 1 & -1 & 1 & -1 \\ 1 & 1 & -1 & -1 \\ 1 & -1 & -1 & 1 \end{pmatrix}$$

$$M = \frac{1}{\sqrt{n}} H \cdot B = \frac{1}{4}\begin{pmatrix} 2+\sqrt{2} & 2-\sqrt{2} & \sqrt{2} & -\sqrt{2} \\ \sqrt{2} & -\sqrt{2} & 2-\sqrt{2} & 2+\sqrt{2} \\ 2-\sqrt{2} & 2+\sqrt{2} & -\sqrt{2} & \sqrt{2} \\ -\sqrt{2} & \sqrt{2} & 2+\sqrt{2} & 2-\sqrt{2} \end{pmatrix} \leftarrow vi$$

METHOD, DEVICE, COMPUTER PROGRAM AND COMPUTER PROGRAM PRODUCT FOR DETERMINING A REPRESENTATION OF A SIGNAL

CROSS-REFERENCE TO RELATED APPLICATION

This application claims priority from PCT Application No. PCT/IB2009/054807, filed on Oct. 29, 2009, the entire contents of which are incorporated herein by reference. This application also claims priority under 35 U.S.C. §119 from European Patent Application No. 08105710.1 filed Oct. 30, 2008, the entire contents of which are also incorporated herein by reference.

TECHNICAL FIELD

The present invention relates to a method, a device, a computer program and a computer program product for determining a representation of a signal and in particular a compressed representation of a signal.

BACKGROUND OF THE INVENTION

Traditional capture and processing of analogue signals consists of two steps: sample, then compress. If the signal is bandlimited, then sample at a little over the Nyquist frequency, namely at twice the frequency range. Lossy compression, for example JPEG for an image, then throws away lots of redundant information. Compressive sampling is a new and promising method to simultaneously sample and compress a signal.

In E. J. Candès and M. Wakin: "An introduction to compressive sampling", IEEE Signal Processing Magazine, 25:21-30, March 2008, a method for compressive sampling is described. A signal, which is sparse under a given basis, is sampled incoherently under a measurement basis. Measurements are taken uniformly at random. A number of measurements is much smaller than a length of the signal.

It is a challenge to provide a method, a device, a computer program and a computer program product for determining a representation of a signal that is simple and that allows for an efficient representation of the signal.

SUMMARY OF THE INVENTION

A method for determining a representation (y) of a signal (s) includes selecting a predetermined number (m) of row vectors (v1, ..., vm) from a predetermined measurement matrix (M). The predetermined measurement matrix (M) being predetermined dependent on a product of a predetermined Hadamard matrix or generalized Hadamard matrix (H) and a predetermined representation matrix (B), the predetermined representation matrix (B) representing a predetermined basis for the signal (s) and determining a respective inner product of the signal (s) and each of the predetermined number (m) of selected row vectors (v1, ..., vm) resulting in a predetermined number (m) of measurements (y1, ..., ym) forming the representation (y) of the signal (s).

In another aspect, a device for determining a representation (y) of a signal (s) includes at least one processing unit (CPU), at least one memory unit (MEM), at least one signal source (SRC) being coupled to the at least one CPU and at least one signal processing unit (SPU). The at least one CPU or at least one SPU (i) selects a predetermined number (m) of row vectors (v1, ..., vm) from a predetermined measurement matrix (M), the predetermined measurement matrix (M) being predetermined dependent on a product of a predetermined Hadamard matrix or generalized Hadamard matrix (H) and a predetermined representation matrix (B), the predetermined representation matrix (B) representing a predetermined basis for the signal (s) and (ii) determines a respective inner product of the signal (s) and each of the predetermined number (m) of selected row vectors (v1, ..., vm) resulting in a predetermined number (m) of measurements (y1, ..., ym) forming the representation (y) of the signal (s).

The advantage is that by using the predetermined measurement matrix that is predetermined dependent on the product of the predetermined Hadamard matrix or generalized Hadamard matrix and the predetermined representation matrix, the predetermined measurement matrix is maximally incoherent with respect to the predetermined representation matrix. This enables the predetermined number of measurements to be predetermined smaller than compared to using another measurement matrix without maximal incoherence with respect to the predetermined representation matrix. The representation of the signal can thus be efficient.

According to another aspect of the invention, a method for determining a representation of a signal is provided. The method includes determining a first transform dependent on the signal by multiplying a predetermined representation matrix representing a predetermined basis for the signal with the signal or by applying a first transform algorithm based on the predetermined basis for the signal to the signal. The method further includes determining a second transform dependent on the first transform by multiplying a predetermined Hadamard matrix or generalized Hadamard matrix with the first transform or by applying as a second transform algorithm a Hadamard transform or fast Hadamard transform to the first transform. The method further includes selecting a predetermined number of measurements from the second transform. The predetermined number of measurements form the representation of the signal.

According to yet another aspect of the invention, a device for determining a representation (y) of a signal (s) includes at least one processing unit (CPU), at least one memory unit (MEM), at least one signal source (SRC) being coupled to the at least one CPU and at least one signal processing unit (SPU), where the at least one CPU or at least one SPU (i) determines a first transform (b) dependent on the signal (s) by multiplying a predetermined representation matrix (B) representing a predetermined basis for the signal (s) with the signal (s) or by applying a first transform algorithm (transf(s, B)) based on the predetermined basis for the signal (s) to the signal (s), (ii) determines a second transform (h) dependent on the first transform (b) by multiplying a predetermined Hadamard matrix or generalized Hadamard matrix (H) with the first transform (b) or by applying as a second transform algorithm (transf(b,H)) a Hadamard transform or fast Hadamard transform to the first transform (b) and (iii) selects a predetermined number (m) of measurements (y1, ..., ym) forming the representation (y) of the signal (s) from the second transform (h).

The advantage is that by determining the first transform based on the predetermined basis for the signal and by determining the second transform based on the predetermined Hadamard matrix or generalized Hadamard matrix or the Hadamard transform or fast Hadamard transform the predetermined number of measurements are taken with respect to a basis that is maximally incoherent with respect to the predetermined basis for the signal. This enables the predetermined number of measurements to be predetermined smaller than compared to using another measurement basis without maximal incoherence with respect to the predetermined basis for the signal. The representation of the signal can thus be efficient. Further, the method is simple. By this, the device, the computer program and the computer program product can also be simple.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

The figures are illustrating.

DETAILED DESCRIPTION OF THE PREFERRED EMBODIMENTS

The term "predetermined" means in the context of this application that the corresponding entity can be determined outside the described method, that is, the entity is predetermined with respect to the described method but is not necessarily a constant. For example, the term "predetermined number" can thus include that the number is determined dependent on the signal and can thus be different for different signals.

Figure 1:
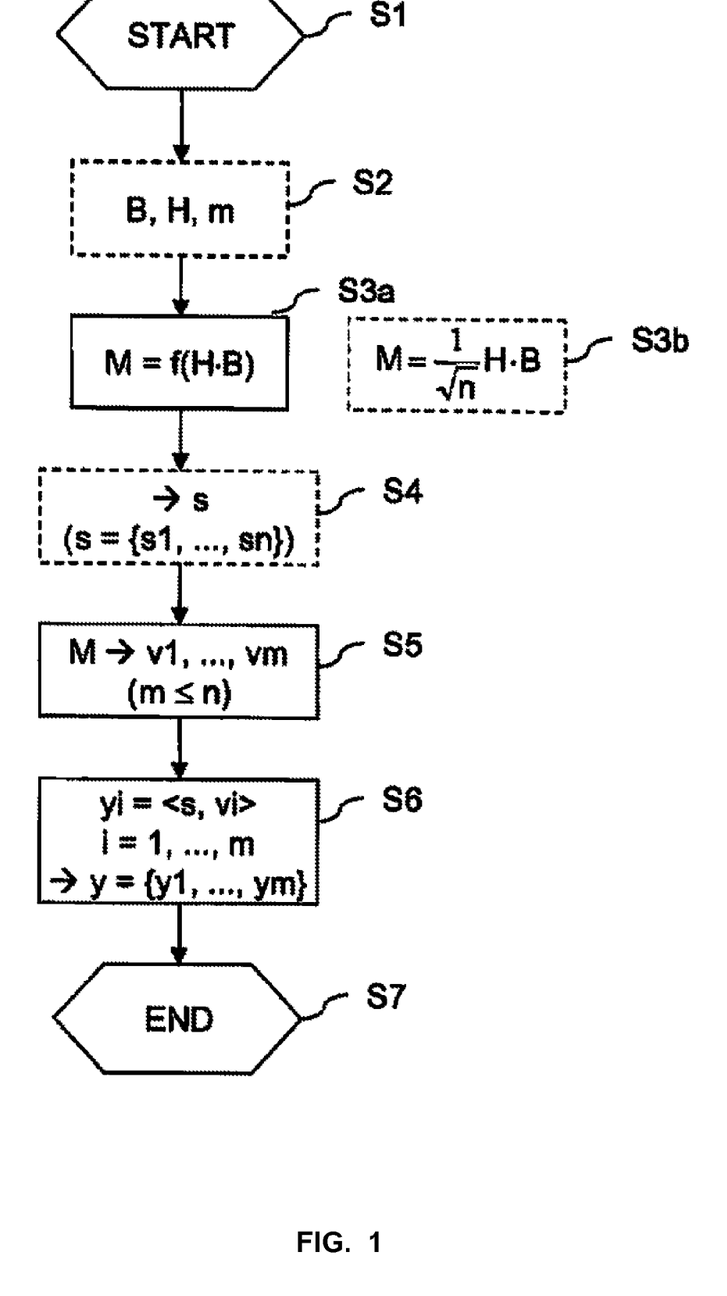
FIG. 1, a first flow chart of a first embodiment of a method for determining a representation of a signal, FIG. 2, a second flow chart of a second embodiment of the method for determining the representation of the signal, FIG. 3, an example for a predetermined representation matrix, a predetermined Hadamard matrix and a predetermined measurement matrix and FIG. 4, a device for determining the representation of the signal.

FIG. 1 shows a first flow chart of a first embodiment of a method and a corresponding computer program for determining a representation y of a signal s of a length n. The method relates to a signal processing scheme called "compressive sampling" or "compressed sensing". The method begins in a step S1. A step S2 may be provided for choosing or determining and/or providing a predetermined representation matrix B and/or a predetermined Hadamard matrix or generalized Hadamard matrix H and/or a predetermined number m. For a specific application, these may be given, but they may also be determined or chosen, for example, dependent on properties of the signal s. For example, the predetermined number m may be determined dependent on the signal s and may thus be different for different signals s, that is, the predetermined number m may be determined adaptively based on the signal s.

The predetermined representation matrix B represents a predetermined basis for the signal s. Preferably, the predetermined representation matrix B is a unitary n×n matrix. Preferably, the signal s is sparse or approximately sparse under the predetermined basis. Particularly, the signal s is k-sparse or approximately k-sparse under the predetermined basis with a sparsity k that is smaller than the length n of the signal s and that preferably is much smaller than the length n of the signal s. The signal s has a k-sparse expansion under the predetermined basis if all but the sparsity k of its values are zero. The signal s has an approximately k-sparse expansion under the predetermined basis if all but the sparsity k of its values have a magnitude of less than a predetermined threshold. This predetermined threshold may be predetermined application dependent. The predetermined threshold generally is predetermined such that the loss of information due to ignoring values below the predetermined threshold is acceptable with regard to the application. Preferably, most but a few values of the expansion of the signal under the predetermined basis are zero or have a magnitude of less than the predetermined threshold. Preferably, the sparsity k amounts to less than ten percent of the length n of the signal s and further preferably amounts to less than five percent of the length n of the signal s. The signal s may then be compressed effectively. The predetermined representation matrix B preferably is not an identity matrix, that is, a product of any Hadamard matrix or generalized Hadamard matrix H and the predetermined representation matrix B preferably always differs from the Hadamard matrix or generalized Hadamard matrix H used in the calculation of the product. The same applies to a transform corresponding to the predetermined representation matrix B, for example a first transform b. An output of this transform preferably always differs from its input.

The predetermined number m preferably is predetermined to be smaller than the length n of the signal s and is preferably predetermined to be much smaller than the length n of the signal s. Preferably, the predetermined number m is predetermined dependent on the sparsity k, that is, the smaller the sparsity k the smaller the predetermined number m and vice versa. As a rule of thumb the predetermined number m may be predetermined to amount to about four times the sparsity k. However, the predetermined number m may be predetermined to be smaller or greater than four times the sparsity k. The predetermined number m may be predetermined dependent on a reconstruction algorithm used for reconstructing the signal s from a predetermined number m of measurements $y_1, \ldots, y_m$ that form the representation y of the signal s and/or dependent on requirements with respect to the application.

Generally, a generalized Hadamard matrix is defined as a n×n matrix satisfying $H \cdot H^* = nI$ and with all its entries being roots of unity. In this context, $H^*$ represents a conjugate transpose of the generalized Hadamard matrix H and I represents an identity matrix. A complex number w is called a $r^{th}$ root of unity if $w^r = 1$. Generally, a Hadamard matrix is a special case of the generalized Hadamard matrix with all its entries being real values, that is +1 or −1. Generally, a generalized Hadamard matrix exists for all lengths n of the signal s. Further, it is hypothesized that a Hadamard matrix exists for the length n of the signal s being 2 or a multiple of 4. For the length n being a power of two the predetermined Hadamard matrix H may be easily constructed with a Sylvester construction for which also a fast implementation exists. Alternatively, a Paley construction may be used when the length n of the signal s amounts to q+1 with q being any prime power congruent to 1 or 3 modulo 4, that is, $q = p^l$ for some positive integer l and prime p and q=1 (mod 4) or q=3 (mod 4). The predetermined generalized Hadamard matrix H may for example be a Fourier matrix with elements $w^{ij}$, with rows i and columns $j = 0, \ldots, n-1$, where the complex $w = \cos(2\pi/n) + i \cdot \sin(2\pi/n)$ is a i·j-root of unity. However, preferably, the predetermined generalized Hadamard matrix H is not a Fourier matrix if the predetermined representation matrix B is the identity matrix.

In a step S3a a predetermined measurement matrix M is provided. The predetermined measurement matrix M represents a predetermined measurement basis for taking the predetermined number m of measurements $y_1, \ldots, y_m$ that form the representation y of the signal s. The predetermined measurement matrix M is predetermined dependent on the predetermined Hadamard matrix or generalized Hadamard matrix H and the predetermined representation matrix B. Particularly, as shown as a step S3b, the predetermined measurement matrix M is predetermined dependent on a product of the predetermined Hadamard matrix or generalized Hadamard matrix H and the predetermined representation matrix B. By this, the predetermined measurement matrix M is maximally incoherent with respect to the predetermined representation matrix B. This holds for any predetermined representation matrix B. This allows for the minimal predetermined number m of measurements y1, ..., ym and thus for the representation y of the signal s being very efficient. Generally, if the predetermined measurement matrix M is a unitary n×n matrix, the predetermined measurement matrix M is maximally incoherent to another unitary n×n matrix, that is the predetermined representation matrix B, if and only if sqrt(n)·B·$M^T$ is a generalized Hadamard matrix, with sqrt(n) representing a square root of the length n of the signal s and $M^T$ representing a transpose of the predetermined measurement matrix M. A coherence between the predetermined representation matrix B and the predetermined measurement matrix M may be defined as μ(B,M)=sqrt(n)·max |<uj,vi>| for 1≤i, j≤n with rows i, j, that is, the coherence is a maximum absolute value of all inner products of row vectors uj of the predetermined representation matrix B and row vectors vi of the predetermined measurement matrix M. In other words, the coherence measures the largest correlation between any two row vectors uj, vi of the predetermined representation matrix B and predetermined measurement matrix M. The maximal incoherence then is achieved when the coherence is smallest.

A step S4 may be provided to provide the signal s. In a step S5, a predetermined number m of row vectors v1, ..., vm of the predetermined measurement matrix M are selected from all available row vectors vi of the predetermined measurement matrix M. In a step S6, an inner product of the signal s and each of the predetermined number m of the row vectors v1, ..., vm is respectively determined. Each of these inner products forms one of the predetermined number m of measurements y1, ..., ym that form the representation y of the signal s. Because the predetermined number m preferably is smaller and particularly much smaller than the length n of the signal s, the representation y of the signal s generally is a compressed representation y of the signal s. The method ends with a step S7.

The selection of the predetermined number m of the row vectors v1, ..., vm of the predetermined measurement matrix M may be performed randomly and preferably uniformly at random. However, the selection may alternatively be performed differently, for example dependent on requirements of the reconstruction algorithm.

Figure 2:
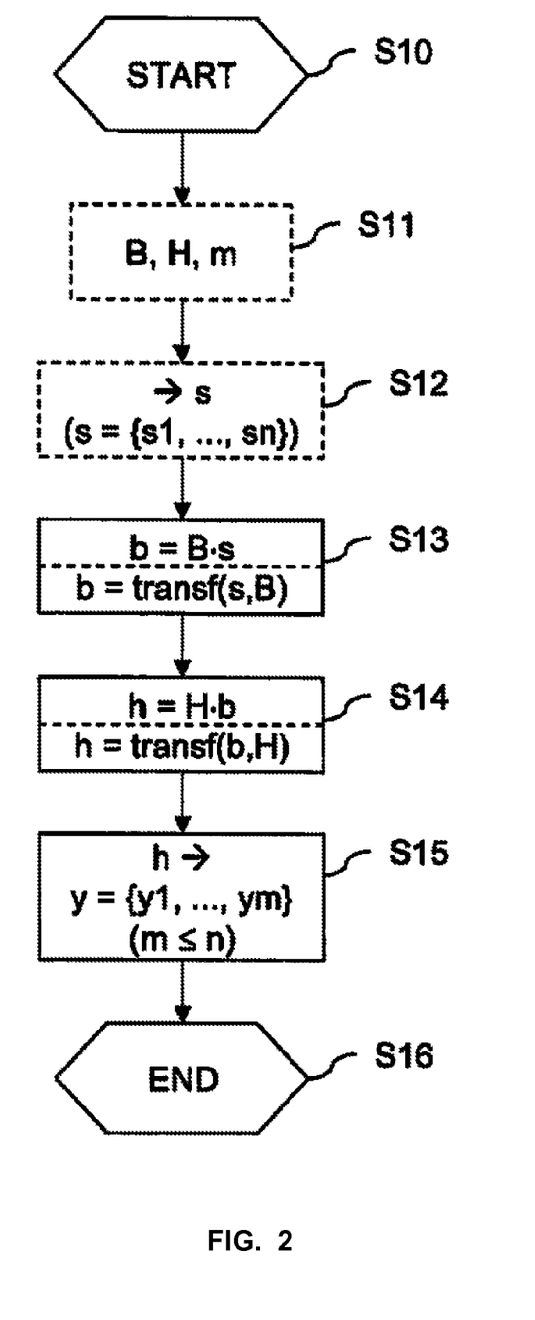

FIG. 2 shows a second flow chart of a second embodiment of a method and a corresponding computer program for determining the representation y of the signal s of the length n. This second embodiment essentially is equivalent to the first embodiment. A difference is that the predetermined measurement matrix M is not used directly and that the predetermined representation matrix B and the predetermined Hadamard matrix or generalized Hadamard matrix H or a respective transform algorithm are applied separately one after the other. The method starts with a step S10. A step S11 corresponds to the step S2. A step S12 corresponds to the step S4.

In a step S13 the first transform b is determined. Two alternatives for this are presented in FIG. 2. In a first alternative, the first transform b is determined dependent on the signal s by multiplying the predetermined representation matrix B and the signal s. In a second alternative, the first transform b is determined dependent on the signal s by applying a first transform algorithm transf(s,B) that is based on the predetermined representation matrix B to the signal s. For example, the first transform algorithm transf(s,B) may comprise a discrete cosine trans-form or a wavelet transform, particularly a fast wavelet transform. However, another first transform algorithm transf(s,B) may be selected. The first and the second alternative are equivalent, but the second alternative may be preferred because of the existence of fast implementations, in software as well as in hardware.

In a step S14 a second transform h is determined. Two alternatives for this are presented in FIG. 2. In a first alternative, the second transform h is determined dependent on the first transform b by multiplying the predetermined Hadamard matrix or generalized Hadamard matrix H and the first transform b. In a second alternative, the second transform h is determined dependent on the first transform b by applying a second transform algorithm transf(b,H) that is based on the predetermined Hadamard matrix or generalized Hadamard matrix H to the first transform b. For example, the second transform algorithm transf(b,H) may comprise a Hadamard transform, a fast Hadamard transform, a discrete Fourier transform or a fast Fourier transform. However, another second transform algorithm transf(b,H) may be selected. The first and the second alternative are equivalent, but the second alternative may be preferred because of the existence of fast implementations, in software as well as in hardware.

In steps S13 and S14 the first alternative of step S13 may be combined with the first or the second alternative of step S14. Similarly, the second alternative of step S14 may be combined with the first or the second alternative of step S14.

In a step S15 the predetermined number m of measurements y1, ..., ym are selected from the second transform h. The selection of the predetermined number m of the measurements y1, ..., ym of the second transform h may be performed randomly and preferably uniformly at random. However, the selection may alternatively be performed differently, for example dependent on requirements of the reconstruction algorithm.

The methods described with reference to FIG. 1 and FIG. 2 may be implemented as a computer program comprising program instructions that can be performed by a computer. A device DEV may comprise a computer for performing the program instructions of the computer program. The computer program may alternatively be part of an operating system or of a basic input/output system of the computer system. A computer readable medium may be provided embodying the program instructions executable by device DEV or the computer system. The computer readable medium may for example be a CD-ROM, a flash memory card, a hard disc or any other suitable computer readable medium. However, the methods described with reference to FIG. 1 and FIG. 2 may also be implemented in hardware, for example as a signal processing unit SPU specifically designed or adapted to perform the method.

Figure 3:
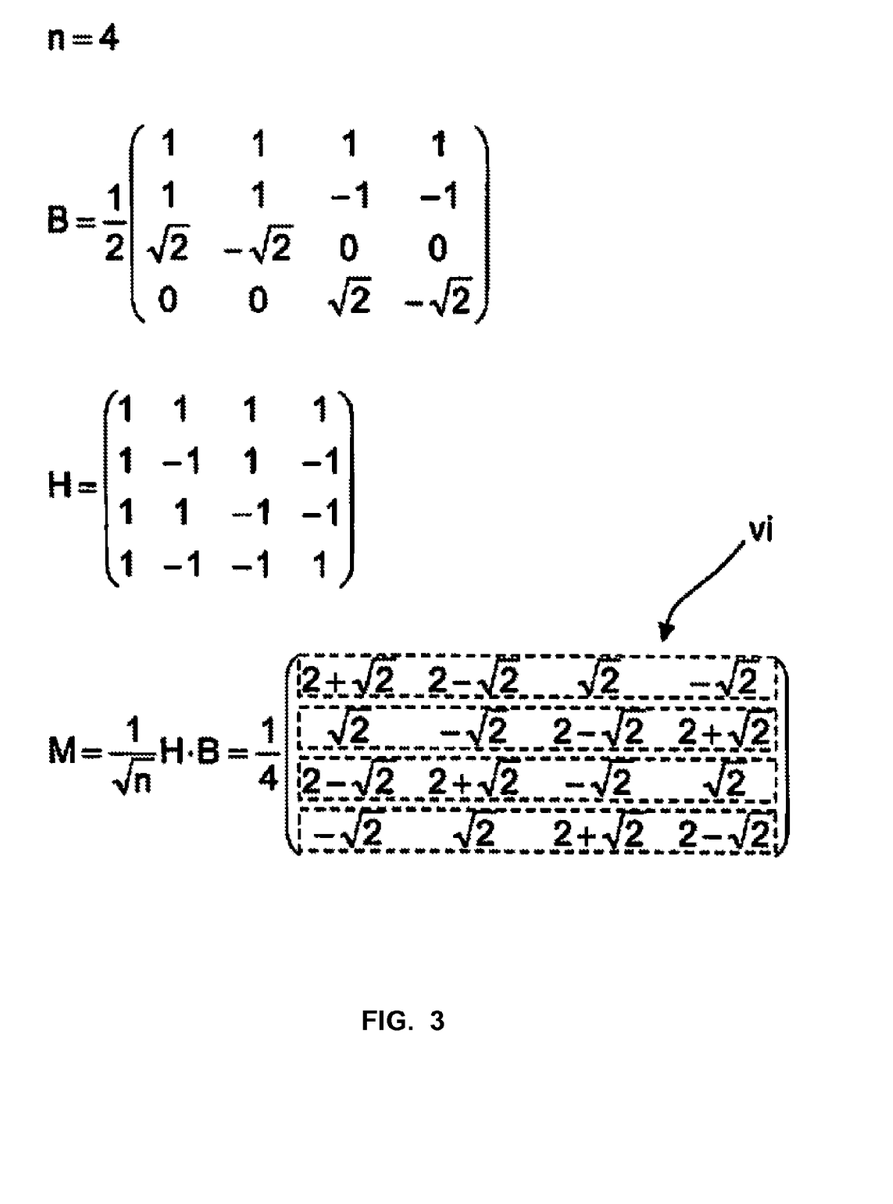

FIG. 3 shows an example of the predetermined representation matrix B, the predetermined Hadamard matrix H and the resulting predetermined measurement matrix M for the length n of the signal s being equal to 4. In this example, the predetermined representation matrix B is predetermined as a 4×4 Haar matrix. The row vectors vi of the predetermined measurement matrix M are each shown within a dashed box. The predetermined measurement matrix M is maximally incoherent with respect to the predetermined representation matrix B. The predetermined representation matrix B and/or the predetermined Hadamard matrix or generalized Hadamard matrix H may alternatively be predetermined differently. Generally, the length n of the signal s will be larger than 4 in most practical cases.

Figure 4:
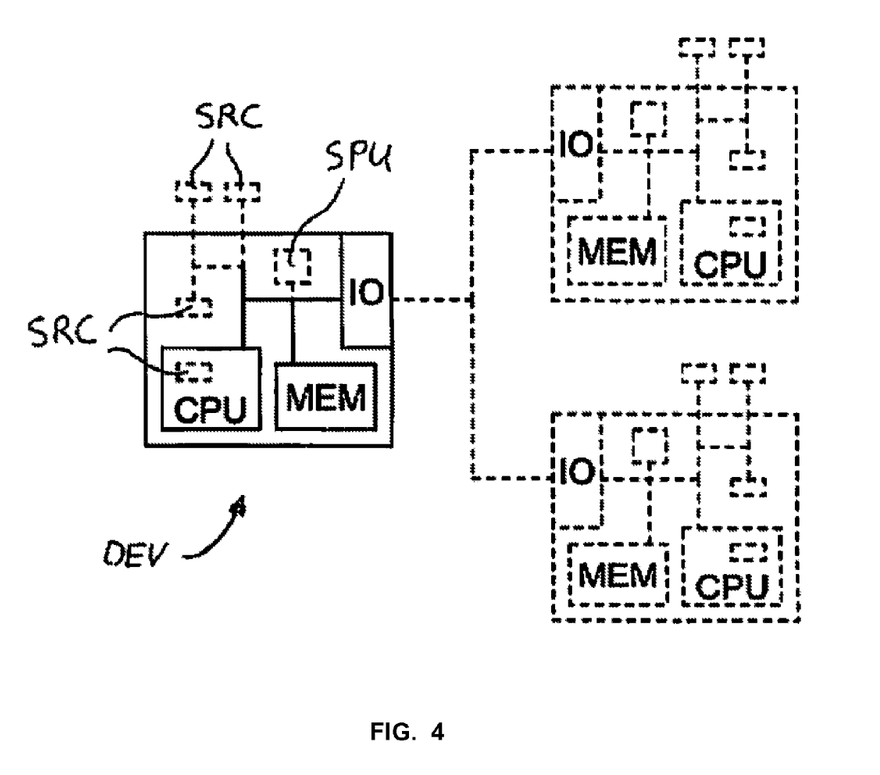

FIG. 4 shows an example of the device DEV. The device DEV may comprise at least one processing unit CPU and at least one memory unit MEM. The computer program comprising the program instructions of the method may be loaded into or stored in the memory unit MEM and executed by the processing unit CPU. Additionally or alternatively, the signal processing unit SPU may be provided for performing the method. At least one signal source SRC is coupled with the processing unit CPU or signal processing unit SPU for providing the signal s. The at least one signal source SRC may be located external to the device DEV or within the device DEV and may comprise a sensor. The device DEV preferably also comprises at least one input/output unit IO. Two or more than two devices DEV may be provided and may be coupled for communication over their respective input/output units IO. For example, at least one of the devices DEV determines the representation y for at least one signal s and transmits this representation y over the input/output unit IO to another of the devices DEV, for example a main or central device DEV, which receives representations y of signals s from at least one device DEV. The compressed representation y of the signal s may be transmitted very efficiently compared to the signal s itself. The representation y of the signal s may additionally or alternatively to the transmitting be stored very efficiently, for example in the at least one memory unit MEM.

In one embodiment, the at least one signal source SRC may be located within the at least one processing unit CPU and, for example, may be designed as a counter. The values of the respective counter, that is the signal s, for example, may be used for a performance monitoring of the respective processing unit CPU and/or device DEV. Compressive sampling may be used for efficient gathering of performance information in a multicore system, that is a system with at least two processing cores per processing unit CPU or with at least two processing units CPU with at least one processing core. Modern processing units CPU contain multiple interacting parts making predicting an actual average of clock cycles per instruction for an execution of a particular piece of code difficult to achieve. This has led to the introduction of an additional unit to the processing unit CPU, a performance monitor unit that samples a performance of the rest of the processing unit CPU. Modern performance monitor units may contain hundreds of counters for indicating bus usage, caches misses, page faults, branch misses etc, as well as complex logic for determining which of the many pipelined instruction and predicted branches actually causes the counter to be increased. The performance monitor units on the distinct processing units CPU need to supply information to a task scheduler. Also, the logic of the performance monitor unit must be kept simple so as to reduce the amount of the core they occupy, that the software that extracts data from them must not consume too many cycles and the distribution of the data must not use too much memory bandwidth, particularly because the data must be gathered and processed on some centralized task scheduler running on one of the processing units CPU. One would expect data from the performance monitor unit to be heavily structured, as the behavior of threads in a recent pass is likely to resemble a present pass. Hence it should be compressible. Compression would be difficult to achieve using standards compression techniques without increasing the amount of storage on the performance monitor unit and introducing delays inappropriate with the needs of task scheduling. If the nature of the signal s is known it is possible to sample only the most important aspects of it to get an immediately compressed representation y of the signal s. The average clock cycles per instruction of the respective processing unit CPU, for example, represents the average number of cycles over some time period required to execute an instruction. Although the actually average clock cycles per instruction is discrete the rate at which it changes is so much faster than any realistic sampling period that it can be considered as a continuous function of time. Compressive sampling may be used to determine the compressed representation y of this actually average clock cycles per instruction as the signal s allowing for a simple performance monitor unit and low requirements for storing and bandwidth.

Another application deals with processing data handled in a streaming fashion, for example in streaming databases etc., and performing queries in these. This can be a daunting operation when there are huge amounts of data at stake. This is a problem that arises, for example, when handling network data information, where a typical problem is to return a list of "heavy-hitters", the top flows responsible for a large amount of the traffic. Another important area is the financial markets such as storage and analysis of stock and FX rates. In any streaming database system there is the data gathering—the what and how to keep something—and the query mechanism—searching through what has been gathered. Compressive sampling, or variations thereof, is a promising technique for determining the what to keep and how to search.

Compressive sampling may further have many imaging applications, for example in magnetic resonance imaging, or short: MRI, and general camera sensor devices, or applications in audio processing. Use of compressive sampling may thus enable development of new cameras, medical image devices, security scanners or audio devices comprising new algorithms for recording and sampling audio. Further applications may be possible with respect to analogue I/O, in communication systems and networking and in particular sensor networks. Other applications may also be possible. Use of compressive sampling may also enable a reduction in power consumption of devices DEV, particularly because sampling may be performed in a computational efficient manner yet with an optimally minimal amount of samples needed.

Although the embodiments of the present invention have been described hereinabove, the present invention is not limited to the foregoing embodiments. Moreover, the effects described in the embodiments of the present invention are merely enumerated examples of the most preferable effects made by the present invention and the effects of the present invention are not limited to those described in the embodiments or examples of the present invention.

We claim:

1. A method for determining a representation (y) of a signal (s), comprising:
    selecting, with a processing unit, a predetermined number (m) of row vectors (v1, . . . , vm) from a predetermined measurement matrix (M), the predetermined measurement matrix (M) being predetermined dependent on a product of a predetermined Hadamard matrix or generalized Hadamard matrix (H) and a predetermined representation matrix (B), the predetermined representation matrix (B) representing a predetermined basis for the signal (s); and
    determining, with the processing unit, a respective inner product of the signal (s) and each of the predetermined number (m) of selected row vectors (v1, . . . , vm) resulting in a predetermined number (m) of measurements (y1, . . . , ym) forming the representation (y) of the signal (s).

2. The method according to claim 1, wherein a Fourier matrix is used as the generalized Hadamard matrix (H).

3. The method according to claim 1, wherein the selection of the predetermined number (m) of the row vectors (v1, . . . , vm) comprises selecting the predetermined number (m) of the row vectors (v1, ..., vm) uniformly at random from all row vectors (vi) of the predetermined measurement matrix (M).

4. The method according to claim 1, wherein the predetermined representation matrix (B) or predetermined basis for the signal (s) is being selected such that the signal (s) is k-sparse or with respect to a predetermined threshold approximately k-sparse under the predetermined basis for the signal (s) with a sparsity (k) being smaller than a length (n) of the signal (s).

5. A non-transitory computer readable storage medium tangibly embodying a computer readable program code having computer readable instructions which when implemented, cause a computer to carry out the steps of the method according to claim 1.

6. A method for determining a representation (y) of a signal (s), comprising:
   determining, with a processing unit, a first transform (b) dependent on the signal (s) by multiplying a predetermined representation matrix (B) representing a predetermined basis for the signal (s) with the signal (s) or by applying a first transform algorithm (transf(s,B)) based on the predetermined basis for the signal (s) to the signal (s);
   determining, with the processing unit, a second transform (h) dependent on the first transform (b) by multiplying a predetermined Hadamard matrix or generalized Hadamard matrix (H) with the first transform (b) or by applying as a second transform algorithm (transf(b,H)) a Hadamard transform or fast Hadamard transform to the first transform (b); and
   selecting, with the processing unit, a predetermined number (m) of measurements (y1, ..., ym) forming the representation (y) of the signal (s) from the second transform (h).

7. The method according to claim 6, wherein a Fourier matrix is used as the generalized Hadamard matrix (H).

8. The method according to claim 6, wherein the selection of the measurements (y1, ..., ym) comprises selecting the measurements (y1, ..., ym), from all elements of the second transform (h).

9. The method according to claim 6, wherein the predetermined representation matrix (B) or predetermined basis for the signal (s) is being selected such that the signal (s) is k-sparse or with respect to a predetermined threshold approximately k-sparse under the predetermined basis for the signal (s) with a sparsity (k) being smaller than a length (n) of the signal (s).

10. A non-transitory computer readable storage medium tangibly embodying a computer readable program code having computer readable instructions which when implemented, cause a computer to carry out the steps of the method according to claim 6.

11. A device for determining a representation (y) of a signal (s) comprising:
   at least one processing unit (CPU);
   at least one memory unit (MEM);
   at least one signal source (SRC) being coupled to said at least one CPU; and
   at least one signal processing unit (SPU);
   wherein said at least one CPU or at least one SPU (i) selects a predetermined number (m) of row vectors (v1, ..., vm) from a predetermined measurement matrix (M), the predetermined measurement matrix (M) being predetermined dependent on a product of a predetermined Hadamard matrix or generalized Hadamard matrix (H) and a predetermined representation matrix (B), the predetermined representation matrix (B) representing a predetermined basis for the signal (s), and (ii) determines a respective inner product of the signal (s) and each of the predetermined number (m) of selected row vectors (v1, ..., vm) resulting in a predetermined number (m) of measurements (y1, ..., ym) forming the representation (y) of the signal (s).

12. The device according to claim 11, wherein the CPU and SPU operate simultaneously.

13. The device according to claim 11, wherein the CPU and SPU operate sequentially with respect to each other.

14. The device according to claim 11, further comprising at least one input/output unit.

15. A device for determining a representation (y) of a signal (s) comprising:
   at least one processing unit (CPU);
   at least one memory unit (MEM);
   at least one signal source (SRC) being coupled to said at least one CPU; and
   at least one signal processing unit (SPU);
   wherein said at least one CPU or at least one SPU (i) determines a first transform (b) dependent on the signal (s) by multiplying a predetermined representation matrix (B) representing a predetermined basis for the signal (s) with the signal (s) or by applying a first transform algorithm (transf(s,B)) based on the predetermined basis for the signal (s) to the signal (s), (ii) determines a second transform (h) dependent on the first transform (b) by multiplying a predetermined Hadamard matrix or generalized Hadamard matrix (H) with the first transform (b) or by applying as a second transform algorithm (transf(b,H)) a Hadamard transform or fast Hadamard transform to the first transform (b) and (iii) selects a predetermined number (m) of measurements (y1, ..., ym) forming the representation (y) of the signal (s) from the second transform (h).

16. The device according to claim 15, wherein the CPU and SPU operate simultaneously.

17. The device according to claim 15, wherein the CPU and SPU operate sequentially with respect to each other.

18. The device according to claim 15, further comprising at least one input/output unit.

* * * * *